United States Patent
Hebert et al.

(10) Patent No.: US 6,545,497 B2
(45) Date of Patent: Apr. 8, 2003

(54) METHOD AND APPARATUS OF TESTING MEMORY DEVICE POWER AND GROUND PINS IN AN ARRAY ASSEMBLY PLATFORM

(75) Inventors: Dave Hebert, Caldwell, ID (US); Dave Remmerden, Kuna, ID (US); Dave Reichle, Boise, ID (US); Gary Chadwick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/809,727

(22) Filed: Mar. 15, 2001

(65) Prior Publication Data

US 2002/0132382 A1 Sep. 19, 2002

(51) Int. Cl.[7] ............................................... G01R 31/26
(52) U.S. Cl. ..................... 324/765; 324/761; 324/158.1
(58) Field of Search ................................ 324/765, 761, 324/763, 764, 158.1

(56) References Cited

U.S. PATENT DOCUMENTS 5,794,175 A * 8/1998 Conner .................... 324/158.1
5,969,537 A * 10/1999 Kanno et al. ............... 324/760
6,297,659 B1 * 10/2001 Saito .......................... 324/760
6,329,831 B1 * 12/2001 Bui et al. .................... 324/760

* cited by examiner

Primary Examiner—Kamand Cuneo
Assistant Examiner—Tung X. Nguyen
(74) Attorney, Agent, or Firm—Fletcher, Yoder & Van Someren

(57) ABSTRACT

An apparatus and technique for performing continuity tests of power and ground pins on a packaged integrated circuit. The technique includes using a first and second fanout circuit each including a number of signal paths. Each signal path includes a switch and corresponds to a power or ground socket on a board configured to hold a number of integrated circuit packages. The fanout circuits allow full device testing, as well as testing of individual pins. By controlling the state of the switches, power and ground may be selectively supplied to power and ground pins to check the continuity of the signals from the integrated circuit device within the package to the external pins provided to route the signal to an external device.

33 Claims, 1 Drawing Sheet

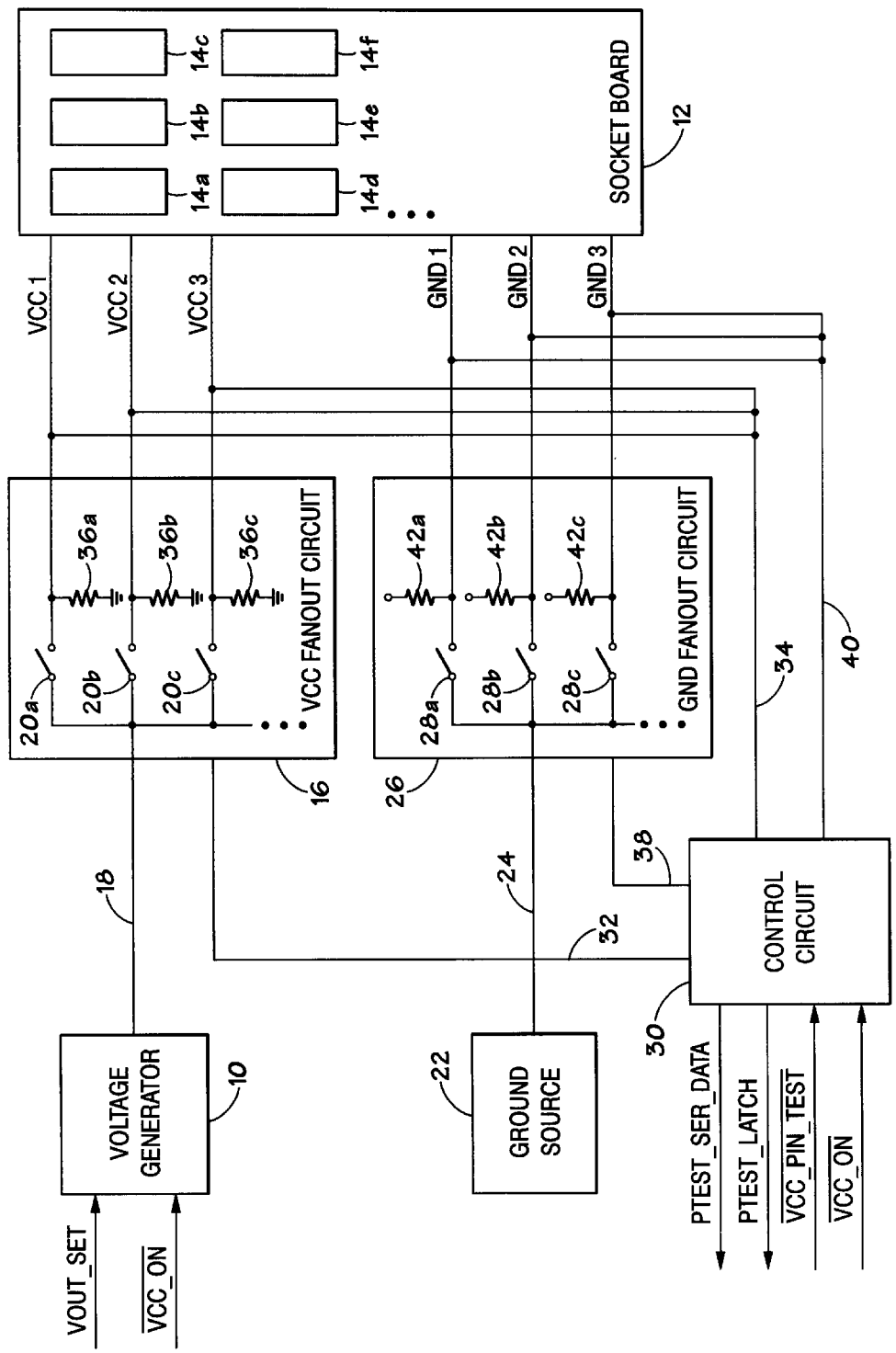

METHOD AND APPARATUS OF TESTING MEMORY DEVICE POWER AND GROUND PINS IN AN ARRAY ASSEMBLY PLATFORM

BACKGROUND OF THE INVENTION

1. Field of the Invention

The present invention relates generally to integrated circuit device assembly and, more particularly, to testing an integrated circuit device for open circuits and short circuits in the power and ground pins.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Integrated circuits are generally mass produced by fabricating thousands of identical circuit patterns on a single semiconductor wafer and subsequently dividing them into identical die or chips. To produce the integrated circuit, many commonly known processes are used to modify, remove, and deposit material onto the semiconductor wafer, which is generally made of silicon. Processes such as ion implantation, sputtering, etching, chemical vapor deposition, and variations thereof are among the processes commonly used. These processes are often selectively applied to an integrated circuit through the use of a masking process. In the masking process, a photomask containing patterned structures to be fabricated is created, and the wafers are coated with a photo-lithographic material, such as a photoresist. The resist-coated wafer is exposed to ultraviolet light through a photomask to soften or harden parts of the photoresist depending on the type of photoresist used. Once the softened parts of the photoresist are removed, the wafers are treated by one of the processes discussed above to modify, remove, or replace the part unprotected by the photoresist, and then the remaining photoresist is stripped from the semiconductor wafer. The masking process permits specific areas of the integrated circuit to be modified, removed, or replaced.

Once the active and passive parts are fabricated in and on the wafer surface, one or more layers of conductive material, such as metal, for electrically connecting circuit components is added, and a protective layer is deposited over the silicon wafer. The wafer is visually evaluated and electrically tested to determine which integrated circuit die are good so that they may be packaged for use. After the semiconductor devices are tested in wafer form, they may be separated through a sawing process. The electrically good die are generally packaged in a protective coating. The packaged device may again be tested using various testing systems.

Electrical tests may be performed numerous times during and after wafer fabrication. The integrated circuits are generally tested while the integrated circuits are still in wafer form, after the integrated circuits have been excised into single die, and once the integrated circuit has been packaged for use in a system. Various pieces of electrical test equipment are used to check for open circuits and short circuits in the power, ground, and signal paths of each integrated circuit. Parametric tests, functional tests, and continuity tests, among others, may be performed. Often, the test equipment used to test the integrated circuits electrically vary from test to test, often requiring manual movement of the parts from one piece of test equipment to another. Each act of human intervention and each act of inserting and removing a wafer, integrated circuit die, or packaged integrated circuit from a piece of test equipment adds an additional risk for injecting failures into the integrated circuit device. Most of the wafer fabrication process is an automated process which minimizes human contact with the integrated circuits. Not only does this increase volume production, but it minimizes contamination and breakage due to human intervention.

Packaged integrated circuits include an additional component which may be susceptible to failure. Packaged integrated circuits may include conductive pins or balls, for example, which may be used to carry signals to and from active circuits on the device. Continuity from the device to the pins or balls is important to the incorporation of the packaged device into a system. Thus, various tests may be performed on various pieces of test equipment to insure full functionality and continuity of the packaged integrated circuit. However, the insertion and re-insertion of devices into various test sockets increases the likelihood of pin/ball breakage. It would be advantageous to minimize the movement of integrated circuit devices between pieces of test equipment, thereby reducing any additional human intervention while still insuring that all necessary electrical tests are conducted.

The present invention may be directed to addressing one or more of the problems set forth above.

BRIEF DESCRIPTION OF THE DRAWINGS

The foregoing and other advantages of the invention will become apparent upon reading the following detailed description and upon reference to the drawings in which:

FIGURE illustrates a block diagram of a power and ground pin verification scheme in accordance with the present invention.

DETAILED DESCRIPTION OF SPECIFIC EMBODIMENTS

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

After wafer fabrication, visual inspection, and electrical tests, functional or electrically good integrated circuit devices are identified for use in a circuit or electronic product or system. However, to be used in a system, each good device must be excised from the wafer and, in most cases, put into a protective package. The type of package used will vary depending on the application and system in which the integrated circuit device is to be incorporated. Basic functions of a semiconductor package may be to provide a substantial lead system for electrical connection into a system, to provide physical protection, to provide environmental protection, and to provide for heat dissipation during chip operation. Each of these factors may be considered before choosing a package type such as metal, ceramic, epoxy resin, or polyamides, for example.

The mechanism for providing electrical conductivity from the integrated circuit die through the protective packaging and to a system board or other apparatus for incorporating a device into a system also varies depending on the application. Three techniques are generally used to connect packages to the printed circuit board: thru-hole, surface mount, and tape automated bonding (TAB). Regardless of the packaging mechanism, leads, pins, solder balls, or any other means may be used to attach the package to a printed circuit board to provide electrical conductivity.

Regardless of the packaging and connection techniques, the purpose of the wafer fabrication process is to provide the customer with a specific integrated circuit device, such as a memory, that performs to specified parameters. Thus, one of the last steps in production is to perform an electrical test of the completed unit to verify that it performs to the specifications. These tests are similar to the electrical die tests that are generally performed when the integrated circuit die are in wafer form. The overall objective is to verify that the good chips identified during prior electrical tests have not been compromised by the packaging process and that all necessary signal pads on the die have an electrical path to the outside of the package.

Aside from parametric testing and functional testing, memory devices, in particular, are generally tested for power and ground conductivity. Memory devices generally include tens to hundreds of pins dedicated to power and ground planes. Generally, each of the power pins are tied together within a package on a single power plane. Similarly, each of the ground pins may be tied together on a single ground plane. Parametric and functional testing may be performed by supplying a single power signal and a single ground signal, since the power and ground planes will sufficiently distribute the respective signals to all of the associated pads in the package. Continuity tests are generally performed by testing the signal level at each pin to verify that it is receiving an appropriate voltage. The continuity tests are generally performed on different test systems which are configured specifically for continuity testing. The present system provides a mechanism for testing the individual power and ground pins for continuity without necessitating that the device be removed from one test system configured for parametric testing and inserted into another test system configured for continuity testing. This is generally accomplished by using a board which provides one or more fanout circuits. The fanout circuits provide a mechanism for isolating individual pins for a device under test. Isolation of the pins facilitates testing for open circuits and short circuits.

Referring specifically to FIGURE, a block diagram depicting a power/ground pin verification system is illustrated. During device testing, a voltage source, such as a voltage generator 10 provides a power signal Vcc. During parametric and functional device testing, a signal VDUT_SET received from the test software sets the analog level of the power signal Vcc. A control signal VCC_ON (active low) may be used to enable both the power signal Vcc and a ground signal GND to a packaged integrated circuit (I/C) under test. A socket board 12 may be configured to hold one or more packaged I/Cs 14a-f during electrical testing. The number of packaged I/Cs 14a-f supported by the socket board 12 may vary. Each of the packaged I/Cs 14a-f includes a plurality of power pins configured to receive a power signal Vcc. The socket board 12 includes a mechanism, such as a socket receptacle (not shown), to secure mechanically each packaged JIG 14a-f to the socket board 12 and further to provide conductive traces for signal flow to each of the pins on the packaged JIG 14a-f. includes a plurality of power pins configured to receive a power signal Vcc. The socket board 12 includes a mechanism, such as a socket receptacle (not shown), to secure mechanically each packaged I/C 14a-f to the socket board 12 and further to provide conductive traces for signal flow to each of the pins on the packaged I/C 14a-f.

The voltage generator 10 provides one or more Vcc signals to a Vcc fanout circuit 16 via a signal path 18. The Vcc fanout circuit 16 comprises a plurality of switches 20a-c corresponding to each of the power pins on each of the I/C packages 14a-f supported by the socket board 12. Once the power signal Vcc provided by the voltage generator 10 via the signal path 18 is delivered to the Vcc fanout circuit 16, the power signal Vcc is divided to provide a voltage signal through each of the paths created by the switches 20a-c. During functional testing, each of the switches 20a-c may be closed to provide a current path from the voltage generator 10 to each of the power pins on the packaged I/Cs 14a-f. The power signal Vcc is carried to each of the power pins on the packaged I/Cs 14a-f via individual signal paths Vcc1, Vcc2, and Vcc3. Each power pin is electrically coupled to a single power plane within each packaged I/C 14a-f. It should be understood that while only three switches 20a-c and three corresponding signal paths Vcc1, Vcc2, and Vcc3 are illustrated, the actual number of switches 20a-c and corresponding signal paths Vcc1, Vcc2, and Vcc3 is variable depending on the number of sockets provided on the socket board 12 and the number of power pins for each packaged I/C 14a-f. Further, more than one signal path 18 from the voltage generator 10 to the Vcc fanout circuit 16 may be provided. Each signal path 18 may, for instance, provide a source current drive of 500 mA, per signal.

Similarly, a ground signal GND may be provided by a ground source 22 via a ground path 24. The ground signal GND is delivered to a GND fanout circuit 26, and the ground signal GND is divided to provide a ground signal through each of the paths created by the switches 28a-c. During functional testing, each of the switches 28a-c may be closed to provide a ground path from the ground source 22 to each of the ground pins on the packaged I/Cs 14a-f. The ground signal GND is carried to each of the ground pins on the packaged I/Cs 14a-f via individual ground paths GND1, GND2, and GND3. Each ground pin is electrically coupled to a single ground plane within each packaged I/C 14a-f. It should be understood that while only three switches 28a-c and three corresponding ground paths GND1, GND2, and GND3 are illustrated, the actual number of switches 28a-c and corresponding ground paths GND1, GND2, and GND3 is variable depending on the number of sockets provided on the socket board 12 and the number of ground pins for each packaged I/C 14a-f. Further, the voltage generator 10 may comprise the ground source 22. A separate ground source 22 may not be necessary to tie the signals to ground. Also, more than one ground path 24 from the ground source 22 to the GND fanout circuit 26 may be provided.

During functional and parametric tests, a control circuit 30 may provide a close command to each of the switches 20a-c and 28a-c. By closing all of the switches 20a-c and 28a-c in the Vcc and GND fanout circuits 16 and 26, Vcc and GND signals are supplied to the packaged I/Cs 14a-f on the socket board 12. While this state of the switches 20a-c and 28a-c accommodates certain tests, checking the power and ground pins may require isolation of each power and ground pin on the packaged I/Cs 14a-f to verify the continuity of the signals to each of the respective pins. Advantageously, the current scheme provides a mechanism for isolating and testing the power and ground pins individually, without having to change test equipment.

In the power pin isolation and verification mode, a signal VCC_PIN_TEST (active low) is enabled through a control circuit 30. This disables Vcc signal paths Vcc1, Vcc2, and Vcc3 to all power pins except one signal path (e.g. Vcc1) per packaged I/C 14a-f under test. To accomplish this, a signal is sent from the control circuit 30 to the Vcc fanout circuit 16 via a command path 32 to close one switch (e.g. switch 20a), while opening the remaining switches (e.g. switches 20b-c). By closing only one switch 20a, a single Vcc signal path, such as Vcc1 is provided to each packaged I/C 14a-f under test. The corresponding power pin on the packaged I/C 14a-f powers the Vcc plane of the packaged I/C 14a-f. Any other power pins connected to the power plane on the packaged I/C are also energized. A feedback path 34 provides feedback from each power pin on each packaged I/C 14a-f to the control circuit 30. The control circuit 30 may include latches and readback circuitry to retain a voltage reading corresponding to each of the power pins on each packaged I/C 14a-f.

Within the Vcc fanout circuit 16, each of the signal paths Vcc1, Vcc2, and Vcc3 is also tied to ground through a weak pull-down resistor 36a, 36b, and 36c. Each power pin corresponding to a signal path with a closed switch should still receive power from the Vcc power plane. If the power pin being checked is not electrically connected to the Vcc power plane (i.e. there is a Vcc open on the power pin), it will be pulled to ground. The voltage reading that is latched in the control circuit 30 will be outside of an acceptable Vcc voltage range, thereby indicating a failure. This information may be latched from the control circuit 30 to a database on the tester on a feedback line PTEST_LATCH. Readback of the fail information may also be serialized and read back from the control circuit 30 on another feedback line PTEST_SER_DATA. It should be noted that while the latches and readback circuitry are illustrated as part of the control circuit 30, these components may be physically and logically separated from the control circuit 30 illustrated in the present embodiment.

Similarly, in ground pin isolation and verification mode, the GND pins may be disconnected from the driving circuitry by VCC_PIN_TEST with the exception of one pin. This disables GND signal paths GND1, GND2, and GND3 to all ground pins except one signal path (e.g. GND1 ) per packaged I/C 14a-f under test. To accomplish this, a signal is sent from the control circuit 30 to the GND fanout circuit 26 via a command path 38 to close one switch (e.g. switch 28a), while opening the remaining switches (e.g. switches 28b-c). By closing only one switch 28a, a single GND signal path, such as GND1 is provided to each packaged I/C 14a-f under test. The corresponding ground pin on the packaged I/C 14a-f will provide a ground to the GND plane of the packaged I/C 14a-f. Any other ground pins connected to the GND plane on the packaged I/C 14a-f should also be grounded. A feedback path 40 provides feedback from each ground pin on each packaged I/C 14a-f to the control circuit 30. The latches and readback circuitry of the control circuit 30 retain a voltage reading corresponding to each of the ground pins on the packaged I/C 14a-f. Within the GND fanout circuit 26, each of the GND signal paths GND 1, GND2, and GND3 is also tied to Vcc through a weak pull-up resistor 42a, 42b, and 42c. Each ground pin corresponding to a GND signal path with a closed switch should still receive a GND signal from the ground plane. If the ground pin being checked is not electrically connected to the GND plane (i.e. there is an open on a ground pin), it will be pulled to high (Vcc), and the voltage reading that is latched in the control circuit 30 will be outside of the acceptable voltage range (around 0 volts), thereby indicating a failure. As with the power pin failures and results, this information may be latched from the control circuit 30 to a database on the tester on a feedback line PTEST_LATCH. Readback of the fail information may also be serialized and read back from the control circuit 30 on another feedback line PTEST_SER_DATA.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of testing power pins in an electronic device comprising the acts of:
   (a) inserting a semiconductor device into a test socket, the semiconductor device having a plurality of power pins;
   (b) providing a power signal to a fanout circuit, the fanout circuit comprising a plurality of switches and configured to receive a power signal and produce a plurality of outputs, each output providing the power signal to a respective one of the plurality of power pins on the electronic device through one of the plurality of switches when the one switch is in a first state;
   (c) placing a first of the plurality of switches in the fanout circuit in a first state;
   (d) placing the remaining of the plurality of switches in a second state; and
   (e) reading a voltage at each of the power pins.

2. The method of testing power pins in an electronic device, as set forth in claim 1, wherein the electronic device comprises a memory device.

3. The method of testing power pins in an electronic device, as set forth in claim 1, wherein the electronic device comprises a semiconductor device.

4. The method of testing power pins in an electronic device, as set forth in claim 1, comprising the act of performing parametric tests without removing the semiconductor device from the test socket.

5. The method of testing power pins in an electronic device, as set forth in claim 1, wherein act (c) comprises the act of placing the first of the plurality of switches in the fanout circuit in a closed state.

6. The method of testing power pins in an electronic device, as set forth in claim 1, wherein acts (a) through (e) are performed in the recited order.

7. A method of testing ground pins in an electronic device comprising the acts of:
   (a) inserting a semiconductor device into a test socket, the semiconductor device having a plurality of ground pins;
   (b) providing a ground signal to a fanout circuit, the fanout circuit comprising a plurality of switches and configured to receive a ground signal and produce a plurality of outputs, each output providing the ground signal to a respective one of the plurality of ground pins on the semiconductor device through one of the plurality of switches when the switch is in a first state;
   (c) placing a first of the plurality of switches in the fanout circuit in a first state;

(d) placing the remaining of the plurality of switches in a second state; and (e) reading a voltage at each of the ground pins.

8. The method of testing ground pins in an electronic device, as set forth in claim 7, wherein the electronic device comprises a memory device.

9. The method of testing ground pins in an electronic device, as set forth in claim 7, wherein the electronic device comprises a semiconductor device.

10. The method of testing ground pins in an electronic device, as set forth in claim 7, comprising the act of performing parametric tests without removing the semiconductor device from the test socket.

11. The method of testing ground pins in an electronic device, as set forth in claim 7, wherein act (c) comprises the act of placing the first of the plurality of switches in the fanout circuit in a closed state.

12. The method of testing ground pins in an electronic device, as set forth in claim 10, wherein acts (a) through (e) are performed in the recited order.

13. A method of verifying the continuity of a plurality of pins on an electronic package inserted in a test socket, the pins comprising a plurality of power pins and a plurality of ground pins, the method comprising the acts of:

(a) enabling a power signal to only one of the plurality of power pins;

(b) measuring a voltage on each of the plurality of power pins;

(c) enabling a ground signal to only one of the plurality of ground pins; and (d) measuring a voltage on each of the plurality of ground pins.

14. The method of verifying the continuity of a plurality of pins on an electronic package, as set forth in claim 13, wherein the electronic package comprises a memory device.

15. The method of verifying the continuity of a plurality of pins on an electronic package, as set forth in claim 13, wherein the electronic package comprises a semiconductor device.

16. The method of verifying the continuity of a plurality of pins on an electronic package, as set forth in claim 13, comprising the act of performing parametric tests without removing the semiconductor device from the test socket.

17. The method of verifying the continuity of a plurality of pins on an electronic package, as set forth in claim 13, wherein act (a) comprises the act of enabling the power signal to only one of the plurality of power pins by closing a first switch.

18. The method of verifying the continuity of a plurality of pins on an electronic package, as set forth in claim 13, wherein act (c) comprises the act of enabling the ground signal to only one of the plurality of ground pins by closing a second switch.

19. The method of verifying the continuity of a plurality of pins on an electronic package, as set forth in claim 13, comprising the act of driving all but the one of the plurality of power pins to a logical low through a plurality of pull-down resistors, each of the plurality of pull-down resistors corresponding to one of the plurality of power pins.

20. The method of verifying the continuity of a plurality of pins on an electronic package, as set forth in claim 13, comprising the act of driving all but the one of the plurality of ground pins to a logical high through a plurality of pull-up resistors, each of the plurality of pull-up resistors corresponding to one of the plurality of ground pins.

21. The method of testing power pins in an electronic device, as set forth in claim 13, wherein acts (a) through (d) are performed in the recited order.

22. An apparatus for testing power and ground pins on an electronic package, the apparatus comprising:

a socket board configured to couple a plurality of electronic packages to power source and a ground source, the electronic packages each comprising a plurality of power and ground pins;

a first fanout circuit comprising a plurality of switches, each of the plurality of switches, having a first node and a second node and providing an electrical path from the power source to a respective one of the plurality of power pins;

a second fanout circuit comprising a plurality of switches, each of the plurality of switches having a first node and a second node and providing an electrical path from the ground source to each of the plurality of ground pins; and a control circuit configured to control each of the switches in the first fanout circuit and the second fanout circuit.

23. The apparatus for testing power and ground pins on an electronic package, as set forth in claim 22, wherein the socket board comprises a plurality of sockets configured to receive a plurality of electronic packages.

24. The apparatus for testing power and ground pins on an electronic package, as set forth in claim 22, wherein the electronic package comprises a memory package.

25. The apparatus for testing power and ground pins on an electronic package, as set forth in claim 22, wherein the electronic package comprises a semiconductor package.

26. The apparatus for testing power and ground pins on an electronic package, as set forth in claim 22, wherein each of the second nodes of each of the plurality of switches in the first fanout circuit is coupled to a ground signal through a resistor.

27. The apparatus for testing power and ground pins on an electronic, as set forth in claim 21, wherein each of the second nodes of each of the plurality of switches in the second fanout circuit is coupled to a power signal through a resistor.

28. The apparatus for testing power and ground pins on an electronic, as set forth in claim 22, wherein the control circuit is configured to read a voltage measurement at each of the plurality of power and ground pins.

29. A test apparatus comprising:

a test socket configured to couple an electronic device to a printed circuit board and to provide an electrical path for both parametric testing and power/ground verification;

a plurality of switches configured to transmit signals when the switches are in a first state;

a plurality of conductive traces coupled between each of the plurality of switches and the test socket; and a control device configured to provide control of the plurality of switches.

30. The test apparatus, as set forth in claim 29, wherein the test apparatus is configured to perform both parametric testing and power pin verification testing without removing the electronic device from the test socket.

31. The test apparatus, as set forth in claim 29, wherein the electronic device comprises a memory device.

32. The test apparatus, as set forth in claim 29, wherein the electronic device comprises a semiconductor device.

33. The test apparatus, as set forth in claim 28, comprising a plurality of resistors, each of the plurality of resistors being coupled between each of the plurality of switches and one of a power source and a ground source.

* * * * *